United States Patent [19]
Ano et al.

[11] Patent Number: 6,087,717
[45] Date of Patent: Jul. 11, 2000

[54] SEMICONDUCTOR DEVICE AND MANUFACTURING METHOD

[75] Inventors: Kazuaki Ano, Hiji Machi; Kensho Murata, Beppu, both of Japan

[73] Assignee: Texas Instruments Incorporated, Dallas, Tex.

[21] Appl. No.: 09/046,299

[22] Filed: Mar. 23, 1998

[30] Foreign Application Priority Data

Mar. 24, 1997 [JP] Japan ....................................... 9-88902

[51] Int. Cl.⁷ .................................................. H01L 23/06
[52] U.S. Cl. ......................... 257/684; 257/698; 257/700; 257/737; 257/738; 438/118
[58] Field of Search ..................... 257/684, 698, 257/700, 737, 738; 361/801; 438/613, 617, 118; 29/840, 831; 156/235

[56] References Cited

U.S. PATENT DOCUMENTS 5,592,025  1/1997  Clark et al. ............................... 257/774
5,616,958  4/1997  Laine et al. ............................... 257/717

*Primary Examiner*—Olik Chaudhuri
*Assistant Examiner*—Douglas A. Wille
*Attorney, Agent, or Firm*—William B. Kempler; Richard L. Donaldson

[57] ABSTRACT

To completely suppress or minimize the voids formed between the insulating substrate and the IC chip in order to prevent the problems of separation and cracking of the chip caused by the aforementioned voids. The present invention is preferably adopted for the Chip Six Package type package or other package types equipped with solder bumps or other external connecting terminals directly beneath the IC chip. For insulating substrate (3), on its chip-carrying surface, there is pattern element (6) in the region beneath the IC chip and free of conductor pattern elements (4) in addition to conductor pattern element (4) for forming electrical connection between the electrode pads and the external connecting terminals of the chip. Said pattern element (6) divides said region into plural small regions A. IC chip (2) is bonded through die paste on insulating substrate (3) such that an end of conductor pattern element (4), pattern element (6) and divided small regions A are covered. Pattern element (6) acts to reduce the shifting of die paste (9) before curing due to the surface tension. As a result, the formation of voids beneath the chip can be completely prevented or minimized.

20 Claims, 5 Drawing Sheets

SEMICONDUCTOR DEVICE AND MANUFACTURING METHOD

TECHNICAL FIELD OF THE INVENTION

The present invention pertains to a type of package structure of semiconductor device and its manufacturing method. In particular, the present invention pertains to a CSP type IC package.

PRIOR ART

In order to meet the demand for smaller size and higher speed in electronic information equipment, efforts have been made to develop technologies to reduce the size of the semiconductor devices carried in them. From the viewpoint of high-density assembly, the so-called bare assembly, in which the conventional package form that provides physical and chemical protection to the IC chip by means of package or the like is omitted, is believed to be the ultimate assembly method. However, due to problems with respect to reliability and handling in assembly, this method has not yet been widely adopted in conventional equipment for domestic use. CSP (Chip Size Package) refers to a high-density package with the size of the IC package equal to or slightly larger than the chip. Like the conventional package, the CSP has a package structure using resin or another sealant to cover the IC chip. Consequently, it has higher reliability and can be handled more easily than the bare assembly.

FIG. 7 is a diagram illustrating an example of the conventional CSP type package. On insulating substrate (3) made of polyimide film and having copper pattern element (4) formed on it, IC chip (2) is bonded through an adhesive commonly known as die paste (9). One end of copper pattern element (4) is located beneath IC chip (2) and connected to solder bump (7) via through-hole (3a) formed on insulating substrate (3).

Problems to be Solved by the Invention

The operation to bond said IC chip on the insulating substrate is performed with the following steps:

(1) A liquid adhesive made of epoxy or another thermosetting resin is applied dropwise on one or several sites on the insulating substrate.

(2) The IC chip is applied under pressure on the surface of the insulating substrate with said adhesive applied dropwise on it, so that the liquid adhesive is spread over almost the entire lower surface of the IC chip.

(3) In this state, the temperature of the atmosphere is raised to cure the liquid adhesive so as to attach the chip.

In this case, in said step (2), voids may be formed due to lack of the aforementioned adhesive in the region beneath the IC chip surrounded by the copper pattern element. This is because, due to the surface tension of the adhesive, the adhesive in the aforementioned region is pulled into the portion between the copper pattern element and the IC chip. When voids are formed beneath the chip, water vapor also forms. During assembly of the package, when the solder reflow process is performed, the water vapor in the voids expands, leading to a separation between the insulating substrate and the IC chip.

Also, the aforementioned voids lead to a decrease in the physical pressure-resistant strength of the IC chip. When the insulating substrate carrying the IC chip is accommodated in dies, and a resin is injected into the dies, the pressure may lead to cracks in the IC chip.

The purpose of the present invention is to completely eliminate or minimize the voids formed under said IC chip, so as to avoid the problem of separation or cracks in the IC chip caused by said voids in order to increase the manufacturing yield of the IC package.

Another purpose of the present invention is to provide a method which can realize the aforementioned purpose without decreasing the productivity of the package and without increasing the cost of the package.

Means to Solve the Problems

The present invention can be adopted preferably on the CSP type package or another package which has solder bumps and other external connecting terminals arranged directly beneath the IC chip so as to have the package size as close to the chip size as possible. In particular, the present invention can be widely applied to various semiconductor devices having a configuration in which at least a portion of the conductor pattern element on the insulating substrate is positioned beneath the IC chip. On the chip carrying surface of the insulating substrate carrying the IC chip, in addition to the conductor pattern element for forming an electrical connection between the electrode pads of the chip and the external connecting terminals, there is a pattern element in the region beneath the IC chip where the conductor pattern element is not arranged. By means of this pattern element, the aforementioned region is divided into plural small regions. The IC chip is bonded through an adhesive layer, that is, die paste, on the insulating substrate such that it covers a portion of the aforementioned conductor pattern element as well as the aforementioned pattern element and the aforementioned divided small regions.

The region beneath the chip is divided into plural small regions by the aforementioned pattern element, so that generation of voids beneath the chip can be completely suppressed or [at least] minimized. That is, the die paste before curing in each of the aforementioned small regions is surrounded by the aforementioned pattern element. As a result, there is little shift of the die paste caused by surface tension. As the die paste before curing can be kept stably in each of the small regions, generation of voids can be suppressed.

The aforementioned pattern element can be formed as a single continuous pattern element or plural divided pattern elements. It is preferred that the aforementioned pattern element comprise plural block-shaped pattern elements set in a staggered configuration. The block-shaped pattern elements may be approximately square with a side in the range of 0.1–1.0 mm, or preferably in the range of 0.3–0.5 mm.

The aforementioned pattern element may be made of any material as long as there are no problems when bonding is performed on the insulating substrate and die paste. From the viewpoint of manufacturing, it is preferred that it be made of the same material as the aforementioned conductor pattern element and be formed on the insulating substrate at the same time that the aforementioned conductor pattern element is formed.

There is no need for the plural small regions formed beneath the aforementioned IC chip to be completely separated from each other by the aforementioned pattern elements. They need only be separated from each other such that the adhesive in a region does not move to the neighboring region due to the aforementioned surface tension. It is preferred that each of the various regions surrounded by the aforementioned block-shaped pattern elements have diameter less than 0.9 mm.

The present invention is preferably adopted for the semiconductor device having a IC chip carried on an insulating substrate with its circuit forming surface facing up. The present invention also can be well adopted to the semiconductor devices of the so-called flip chip type with the IC chip carried with its circuit forming surface facing the side of the insulating substrate. Also, as the aforementioned insulating substrate, it is possible to make use of a hard substrate made of epoxy resin or the like, or a flexible substrate made of polyimide film or the like.

Embodiment of the Invention

In the following, an embodiment of the present invention will be explained with reference to the figures. FIGS. 1 and 2 illustrate the semiconductor device as a CSP type package of the present invention. Semiconductor device (1) has insulating substrate (3) which has a plane size larger than that of IC chip (2). As an application example, insulating substrate (3) is made of a square shaped polyimide film with sides 12 mm long and 0.075 mm thick.

On the surface of insulating substrate (3), plural copper pattern elements (4) are formed to form electrical connections between IC chip (2) and solder bumps (7) as the external connecting terminals. For each copper pattern element (4), one end is positioned on through-hole (3a) formed on insulating substrate (3) and is connected through said through-hole (3a) to solder bump (7). In the present specification, this region will be called bump connecting land (4b) hereinafter. Bump connecting lands (4b) of the various copper pattern elements are set consecutively along each edge of insulating substrate (3) corresponding to the positions of said through-holes (3a) in three columns set side by side in the direction orthogonal to the direction of the row of the bump connecting lands.

The other end of copper pattern element (4) extends outward on said insulating substrate (3) up to the end of the insulating substrate. On the inner side of copper pattern element (4) with respect to the end, region (4a) is formed with a width greater than the line width of the pattern element. One end of conductor wire (5) extending from electrode pad (2a) formed on the circuit-forming surface of IC chip (2) is connected to the aforementioned region with a larger width. This region will be referred to below as wire connecting land (4a). Also, the portion of copper pattern element (4) from wire connecting land (4a) to the end portion of insulating substrate (3) is the portion for use as the test terminal during part of the manufacturing process. From the standpoint of functions, for each copper pattern element (4), one end is bump connecting land (4b), while the other end is wire connecting land (4a). In the application example, copper pattern element (4) has a line width of about 0.04 mm; bump connecting land (4b) has a width of about 0.3 mm; and wire connecting land (4a) has a width of about 0.1 mm. Also, the pitch between the neighboring land connecting lands (4b) is about 0.5 mm.

Plural rectangular pattern elements (6) are arranged in a 2-dimensional configuration at a prescribed distance in the central region surrounded by said copper pattern element (4) on the surface of insulating substrate (3). Rectangular pattern elements (6) are made of the same type of copper foil as used for said copper pattern element (4), and, as will be explained later with reference to the manufacturing process of semiconductor device (1), they are formed together with copper pattern element (4) on insulating substrate (3). In the plan view of the insulating substrate shown in FIG. 4, the configuration of rectangular pattern elements (6) and copper pattern element (4) are clearly shown. As can be seen from this figure, rectangular pattern elements (6) are arranged in a staggered configuration, that is, with adjacent columns shifted with respect to each other. As a result, among the region surrounded by said copper pattern elements (4), the region excluding the portion of rectangular pattern elements (6) is divided into plural small regions. In the following, these regions will be known as divided regions A. Each divided region A is surrounded by four rectangular pattern elements (6). Since each rectangular pattern element (6) is separated from neighboring rectangular pattern elements (6), each divided region A is continuous in space with the neighboring divided regions.

FIG. 5 is a diagram illustrating the relationship between the configuration of rectangular pattern elements (6) and the voids formed by divided regions A surrounded by said rectangular pattern elements. In the figure, the profile of the maximum void that can be formed by divided regions A is indicated by dotted-dashed line V. The side of said void V depends on the configuration of rectangular pattern elements (6), that is, pitch P and size (edge length L) of each rectangular pattern element (6). For void V, contact with the adjacent voids V to form a single large void should be avoided. In order to arrange the voids at a distance so that they do not make contact with each other, if the void diameter is D and the edge length of rectangular pattern element (6) is L, it is necessary to satisfy the relationship of 0.4D<L (Equation (1)). On the other hand, based on test results, in order to meet the condition of level 4 for moisture preventive package (setting at 30° C. and 60% RH for 48 h) in the JEDE (Joint Electron Device Engineering Council) standard, diameter D of each void formed should be 0.9 mm or less in order to get good results. By substituting this requirement into Equation (1), one has L>0.36 mm. In an application example, length L of rectangular pattern element (6) is about 0.4 mm, and pitch P between pattern elements is about 1.0 mm.

As shown in FIGS. 2 and 3, solder mask (8) made of an epoxy resin is coated on the entire surface of insulating substrate (3) on which said copper pattern element (4) and said rectangular pattern elements (6) are formed. In order to bond wire (5), the solder mask on wire connecting land (4a) of the copper pattern element is removed. By means of die paste (9) made of liquid epoxy resin applied dropwise on solder mask (8), IC chip (2) is bonded to insulating substrate (3). In this way, bump connecting lands (4b) of all said rectangular pattern elements (6) and copper pattern elements are positioned beneath IC chip (2). In FIG. 4, a plan view, the region on insulating substrate (3) carrying IC chip (2) is indicated by dash-dot line C.

In the following, the manufacturing method of said semiconductor device (1) using the manufacturing process shown in FIG. 6 will be explained. First, through-holes (3a) are formed on insulating substrate (3) (step (A)). Said through-holes (3a) may be formed by means of punching processing using a punch, or by means of a photolithographic technique. Then, copper foil (11) is laminated over the entire surface of insulating substrate (3) which has through-holes (3a) formed thereon (step (B)). A portion of copper foil (11) is etched using a photolithographic technique to form copper pattern elements (4) and rectangular pattern elements (6) on insulating substrate (3) (step (C)). Then, solder mask (8) is coated over the surface of insulating substrate (3) where said copper pattern elements (4) and rectangular pattern elements (6) are formed, except the peripheral portion where wire connecting lands (4a) of copper pattern elements (4) are formed (step (D)). On exposed copper pattern elements (4) (wire connecting lands (4a)), Ni or Au is plated.

Subsequently, by means of dispenser (12), die paste (9) made of an epoxy resin is applied dropwise on the region of insulating substrate (3) where IC chip (2) is carried (step (E)). Application of die paste (9) should be performed in an amount and at dropwise application positions determined in consideration of the requirement that the die paste should be spread evenly beneath the IC chip. Before curing of liquid die paste (9), a prescribed pressure is applied from above IC chip (2) manufactured in another process, so that die paste (9) is spread over the entire region of the lower surface of IC chip (2) (step (F)). In this case, the die paste in the gaps between the various rectangular pattern elements (6), that is, in division regions A shown in FIG. 5, does not migrate into surrounding rectangular pattern elements (6). Consequently, it is possible to avoid formation of voids in various division regions A. In this state, the temperature of the atmosphere is raised by a heater or the like to cure die paste (9), so that IC chip (2) is attached to insulating substrate (3).

After bonding of electrode pad (2a) and wire connecting lands (4a) of copper pattern elements (4) by conductor (5), the chip (2) is sealed by mold resin (13) (step (G)). Finally, solder paste (14) fills through-holes (3a) on insulating substrate (3), solder bumps (7) are transferred and then melted, so that solder bumps (7) and bump connecting lands (4b) are bonded to each other (step (H)). After the aforementioned processing steps, semiconductor device (1) is completed.

In the above, explanation has been made with reference to an embodiment of the present invention. However, the application range of the present invention is not limited to the features in the aforementioned embodiment. In the present invention, in order to ensure that generation of voids in the region beneath the IC chip can be completely suppressed or minimized, it is important to have the pattern elements beneath the chip divided into plural pattern elements. As long as the aforementioned purpose can be realized, various shapes may be adopted as the ideal shape. They may be continuous or may be divided into plural portions. In the aforementioned embodiment, there is a layer of solder mask (8) on insulating substrate (3). However, the present invention is also effective for semiconductor devices having no solder mask (8). In the aforementioned embodiment, the semiconductor device has three columns of solder bumps as the external connecting terminals. However, in the present invention, the number and type of the external connecting terminals are not important. The present invention may also be applied to packages having one or two columns of solder bumps, and PGA (Pin Grid Array) type packages.

Effects of the Invention

According to the present invention, the voids generated beneath the IC chip can be completely suppressed or minimized. As a result, it is possible to avoid the problems of separation and cracking of the chip caused by voids, and it is possible to increase the manufacturing yield of the IC packages.

Also, when the present invention is embodied, the prescribed pattern elements beneath the IC chip need only be formed. Consequently, there is no decrease in the productivity of the semiconductor device, and there is no increase in production costs.

BRIEF EXPLANATION OF THE REFERENCE NUMERALS

Figure 1:
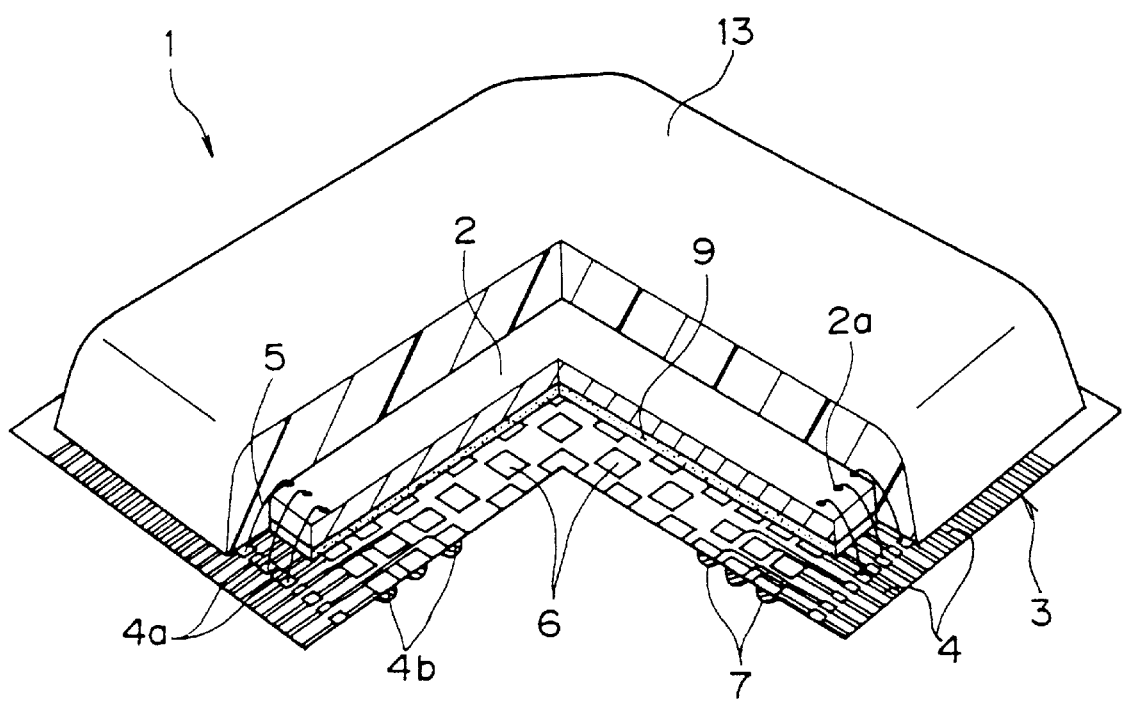
FIG. 1 is a partially cut oblique view of the semiconductor device of the CSP type package of the present invention.
Figure 2:
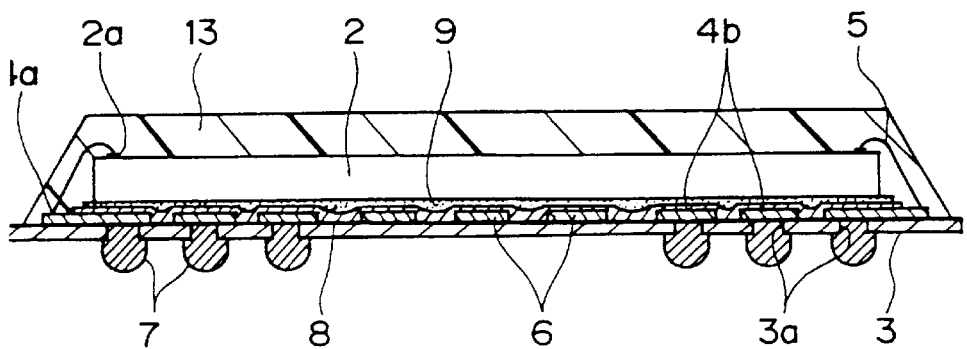
FIG. 2 is a cross-sectional view of the semiconductor device shown in FIG. 1.
Figure 3:
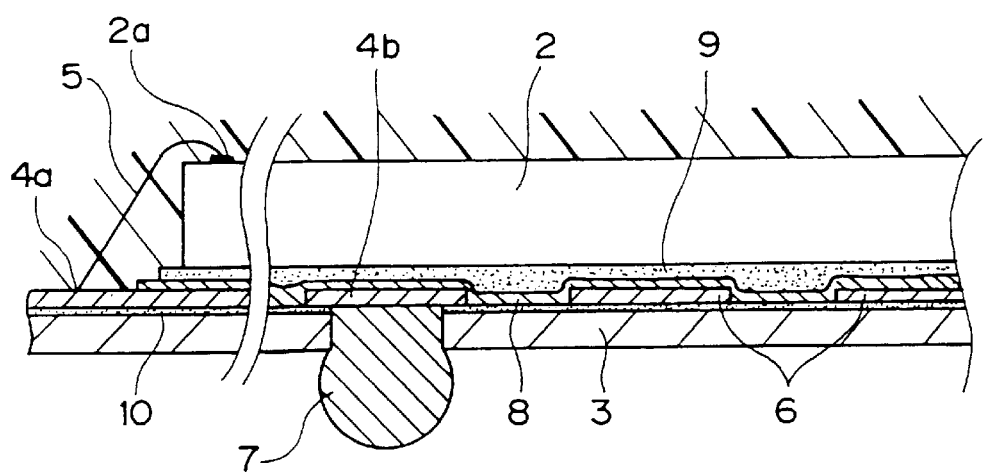
FIG. 3 is an enlarged cross-sectional view of the main portion of FIG. 2.
Figure 4:
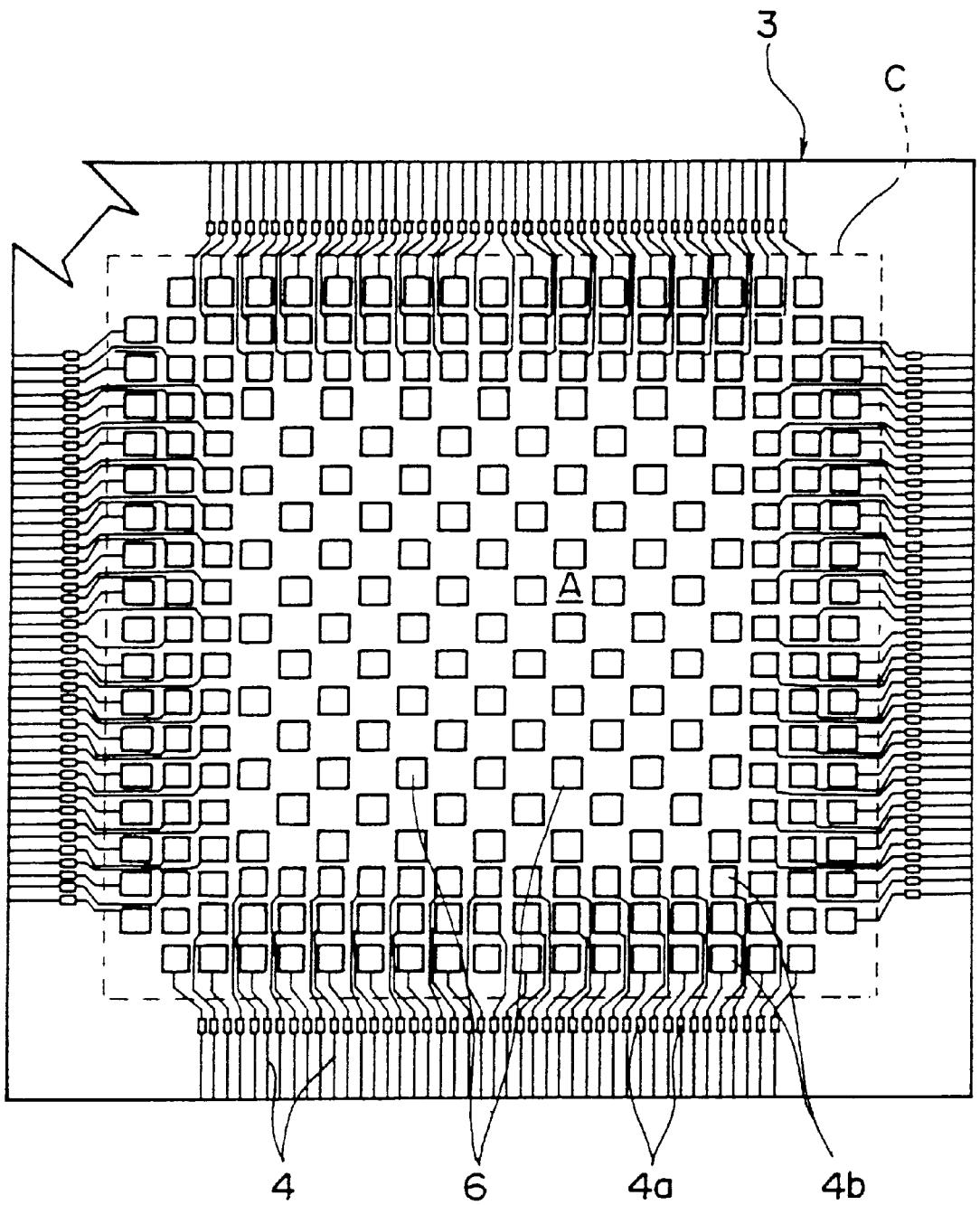
FIG. 4 is a plan view of the insulating substrate illustrating the configuration of the rectangular pattern elements and copper pattern elements.
Figure 5:
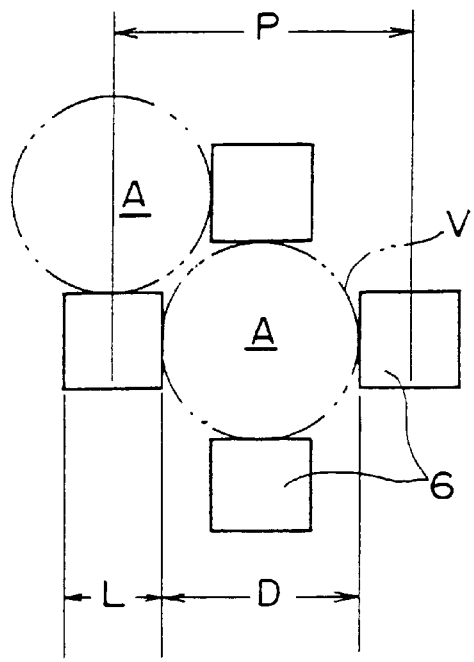
FIG. 5 is a schematic diagram illustrating the relationship between the configuration of the rectangular pattern elements and the voids formed in the divided regions.
Figure 7:
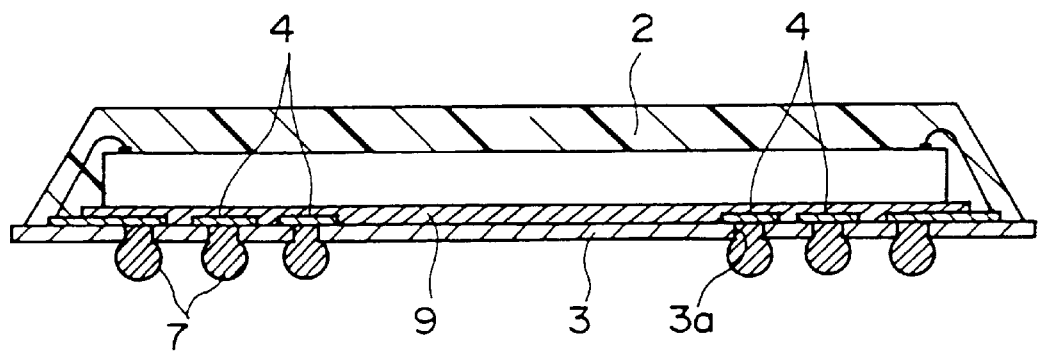
FIG. 7 is a cross-sectional view illustrating an example of the conventional CSP type package.
Figure 6:
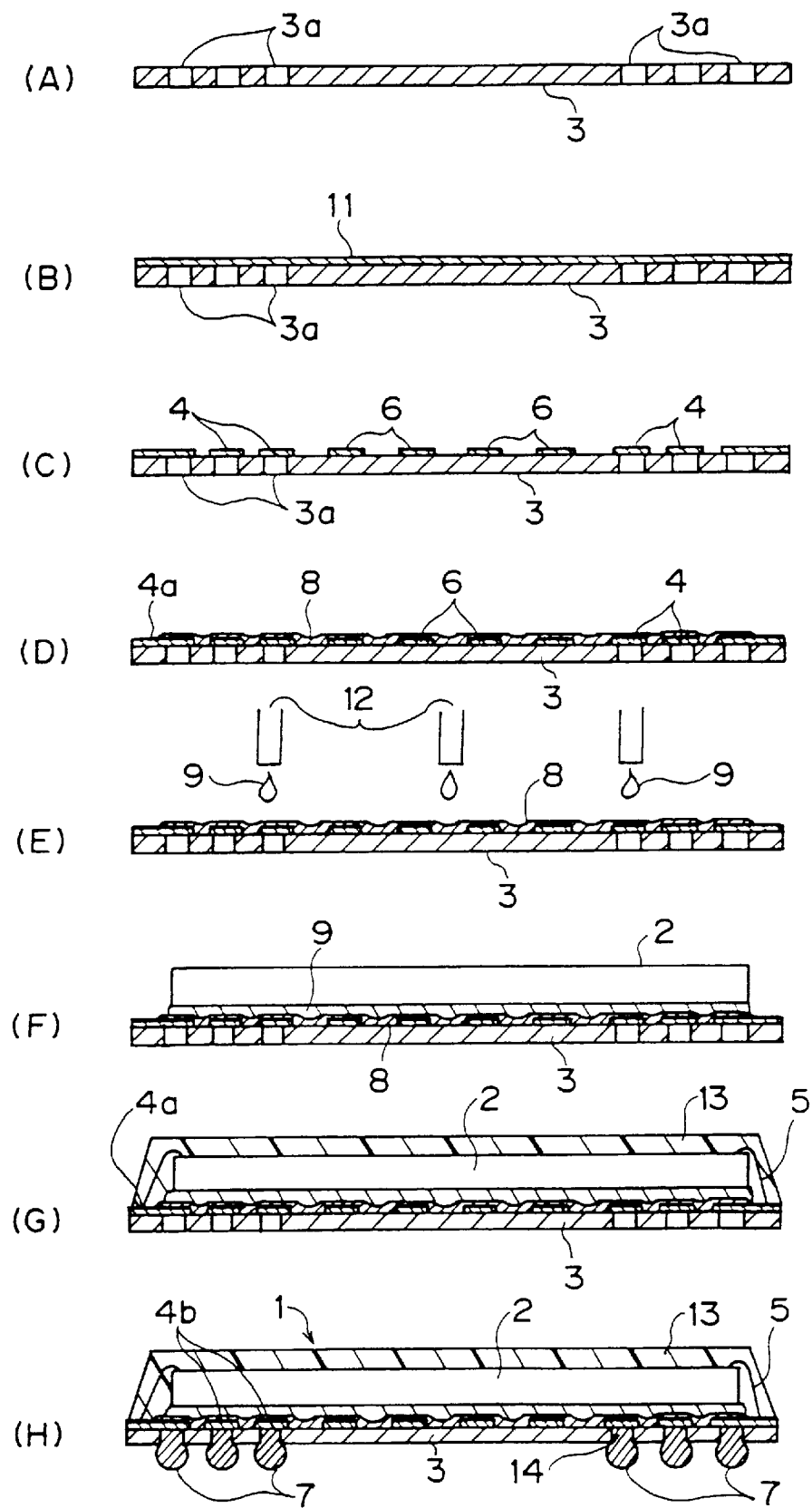
FIG. 6 is a diagram illustrating the manufacturing process of the semiconductor device.

1 Semiconductor device
2 IC chip
2a Electrode pad
3 Insulating substrate
3a Through-hole
4 Copper pattern element
4a Wire connecting land
4b Bump connecting land
5 Conductor wire
6 Rectangular pattern element
7 Solder bump
8 Solder mask
9 Die paste
10 Adhesive layer
11 Copper foil
12 Dispenser
13 Mold resin
14 Solder paste
A Divided region

What is claimed is:

1. A semiconductor device comprising:

an insulating substrate;

an IC chip attached to said substrate by an adhesive layer;

a plurality of conductor pattern elements formed on a surface of said Insulating substrate on which said IC chip is attached, at least a portion of one conductor pattern being located beneath said IC chip;

a plurality of pattern elements formed beneath said IC chip, said pattern elements not being electrically connected and dividing an area beneath said IC chip into a plurality of regions, said regions being spaced by said pattern elements so that said regions do not contact one another.

2. The semiconductor device described in claim 1 wherein said pattern element comprises plural block-shaped pattern elements arranged in a staggered configuration.

3. The semiconductor device described in claim 2, wherein each of the region surrounded by said block-shaped pattern elements has a diameter of 0.9 mm or less.

4. The semiconductor device described in claim 3, wherein said block-shaped pattern elements are approximately square pattern elements with sides of 0.1–1.0 mm.

5. The semiconductor device described in claim 1 wherein said IC chip is carried on said insulating substrate with its circuit-forming surface of said IC chip facing up.

6. The semiconductor device described in claim 1 wherein said insulating substrate has through-holes beneath portions of said conductor pattern elements, and there are solder bumps for external connection for connecting portions of said conductor pattern elements through said through-holes from the surface on the side opposite the surface of the insulating substrate that carries said IC chip.

7. The semiconductor device of claim 1 wherein said pattern elements are distinct from said conductor patterns.

8. The semiconductor device of claim 1 wherein said pattern elements are made from the same material as said conductor patterns.

9. The semiconductor device of claim 7 wherein said pattern elements are made from the same material as said conductor patterns.

10. The semiconductor device described in claim 2 wherein said IC chip is carried on said insulating substrate with its circuit-forming surface of said IC chip facing up.

11. The semiconductor device described in claim 3 wherein said IC chip is carried on said insulating substrate with its circuit-forming surface of said IC chip facing up.

12. The semiconductor device described in claim 4 wherein said IC chip is carried on said insulating substrate with its circuit-forming surface of said IC chip facing up.

13. The semiconductor device described in claim 2 wherein said insulating substrate has through-holes beneath portions of said conductor pattern elements, and there are solder bumps for external connection for connecting portions of said conductor pattern elements through said through-holes from the surface on the side opposite the surface of the insulating substrate that carries said IC chip.

14. The semiconductor device described in claim 3 wherein said insulating substrate has through-holes beneath portions of said conductor pattern elements, and there are solder bumps for external connection for connecting portions of said conductor pattern elements through said through-holes from the surface on the side opposite the surface of the insulating substrate that carries said IC chip.

15. The semiconductor device described in claim 4 wherein said insulating substrate has through-holes beneath portions of said conductor pattern elements, and there are solder bumps for external connection for connecting portions of said conductor pattern elements through said through-holes from the surface on the side opposite the surface of the insulating substrate that carries said IC chip.

16. The semiconductor device described in claim 5 wherein said insulating substrate has through-holes beneath portions of said conductor pattern elements, and there are solder bumps for external connection for connecting portions of said conductor pattern elements through said through-holes from the surface on the side opposite the surface of the insulating substrate that carries said IC chip.

17. The semiconductor device described in claim 7 wherein said IC chip is carried on said insulating substrate with its circuit-forming surface of said IC chip facing up.

18. The semiconductor device described in claim 8 wherein said IC chip is carried on said insulating substrate with its circuit-forming surface of said IC chip facing up.

19. The semiconductor device described in claim 7 wherein said insulating substrate has through-holes beneath portions of said conductor pattern elements, and there are solder bumps for external connection for connecting portions of said conductor pattern elements through said through-holes from the surface on the side opposite the surface of the insulating substrate that carries said IC chip.

20. The semiconductor device described in claim 8 wherein said insulating substrate has through-holes beneath portions of said conductor pattern elements, and there are solder bumps for external connection for connecting portions of said conductor pattern elements through said through-holes from the surface on the side opposite the surface of the insulating substrate that carries said IC chip.

* * * * *